United States Patent [19]
Audoux et al.

[11] Patent Number: 6,084,303
[45] Date of Patent: Jul. 4, 2000

[54] INTEGRATED CIRCUIT COMPRISING CONNECTION PADS EMERGING ON ONE SURFACE

[75] Inventors: Jean-Noël Audoux, Orleans; Benoît Thevenot, Olivet, both of France

[73] Assignee: Schlumberger Systems, Montrouge, France

[21] Appl. No.: 09/180,321

[22] PCT Filed: May 5, 1997

[86] PCT No.: PCT/FR97/00790

§ 371 Date: Nov. 6, 1998

§ 102(e) Date: Nov. 6, 1998

[87] PCT Pub. No.: WO97/42656

PCT Pub. Date: Nov. 13, 1997

[30]   Foreign Application Priority Data

May 7, 1996  [FR]  France ................................ 96 05698

[51] Int. Cl.[7] .......................... H01L 23/48; H01L 23/52; H01L 29/40
[52] U.S. Cl. ........................ 257/758; 257/776; 257/786
[58] Field of Search ................................... 257/700, 758, 257/735, 776, 786, 779, 780, 781

[56]   References Cited

U.S. PATENT DOCUMENTS

| | | |
|---|---|---|
| 3,421,206 | 1/1969 | Baker et al. . |
| 5,006,673 | 4/1991 | Freyman et al. . |
| 5,047,834 | 9/1991 | Kovac et al. . |
| 5,483,100 | 1/1996 | Marrs et al. . |
| 5,665,991 | 9/1997 | Efland et al. . |

*Primary Examiner*—Sheila V. Clark
*Attorney, Agent, or Firm*—Griffin, Butler, Whisenhunt & Szipl, LLP

[57] ABSTRACT

The printed circuit has connection pads emerging in a face of the integrated circuit, which face is covered in an insulating layer (5) having openings in register with the connection pads, and at least one conductor track (7) extending over the first insulating layer and having one end connected to one of the connection pads of the integrated circuit. A second insulating layer (8) covers the first insulating layer and has openings (9) in register with each conductor track (7) of the first layer and in register with each connection pad that is not connected to a conductor track (7), and it carries at least one repositioning conductor track (10) extending over the second insulating layer (8) having one end connected to a conductor track (7) of the first insulating layer.

3 Claims, 2 Drawing Sheets

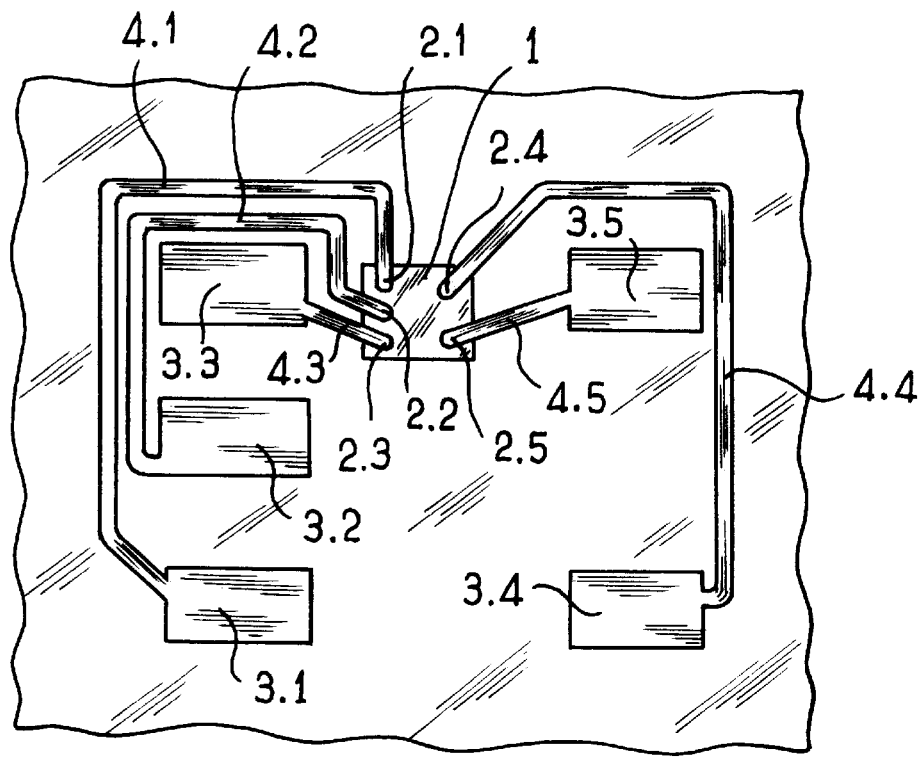
FIG_1
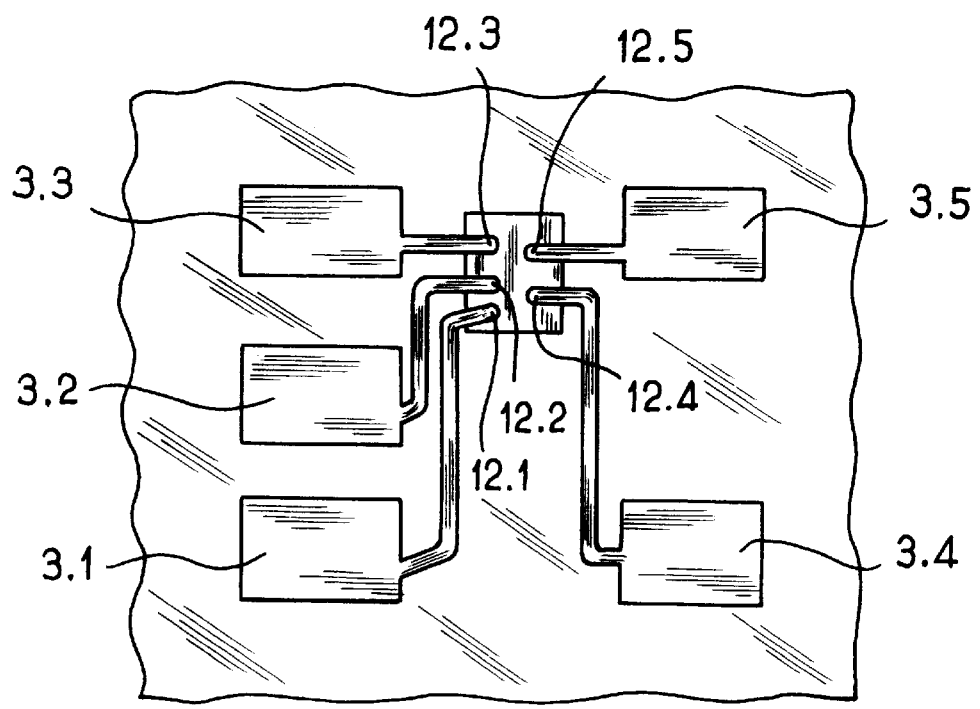
FIG_2

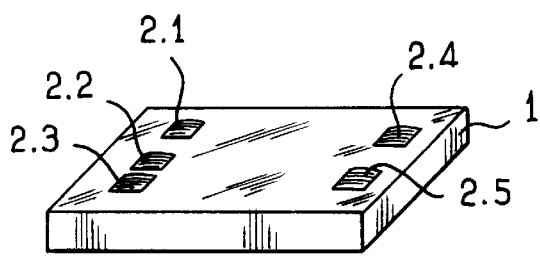
FIG_3
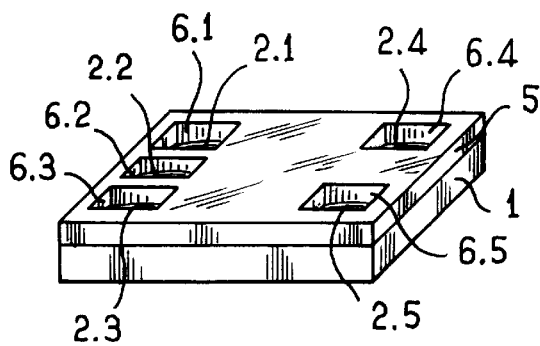
FIG_4
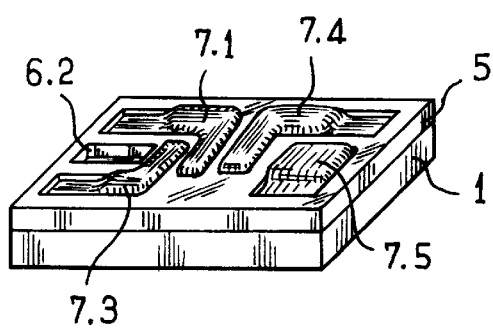
FIG_5
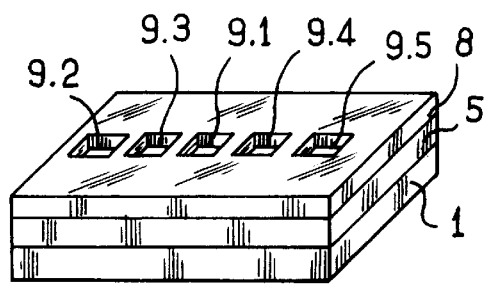
FIG_6
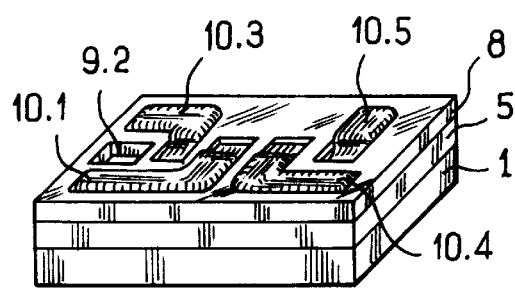
FIG_7
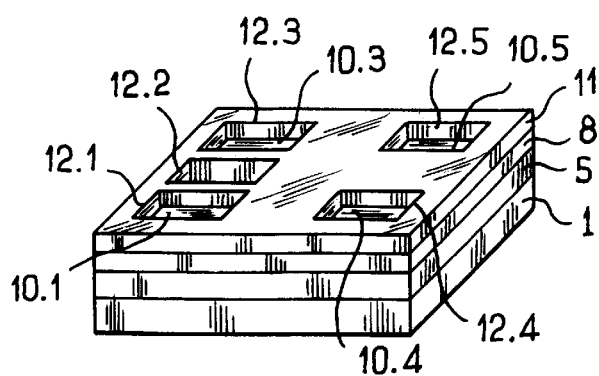
FIG_8

INTEGRATED CIRCUIT COMPRISING CONNECTION PADS EMERGING ON ONE SURFACE

The present invention relates to an integrated circuit including connection pads emerging in a face of the integrated circuit.

BACKGROUND OF THE INVENTION

Integrated circuit cards are known in which the integrated circuit is mounted in the card by initially making a module having a support film onto which the integrated circuit is fixed via its back face, i.e. via its face opposite from its face in which its connection pads emerge. On a face of the support film opposite from its face on which the integrated circuit is fixed, the support film has contact areas which are generally made prior to the integrated circuit being fixed on the support film. In register with the contact areas, the support film has holes allowing connection wires to pass between the connection areas for the integrated circuit and its connection pads. It will be observed that the integrated circuit has its back towards the contact areas. In order to make the connections between the connection pads of the integrated circuit and the contact areas in a manner that is as simple as possible, chip manufacturers have been requested to arrange connection pads in an order that corresponds to the contact areas so that each link wire can pass directly from a connection pad to a contact area without any need to go round another connection pad or to cross another connection wire.

That type of mount for mounting an integrated circuit in a card is presently the most widespread, but another type of mount has recently appeared in which the integrated circuit is fixed directly in a cavity of the card with the connection pads of the integrated circuit flush with the face of the card that includes the contact areas. An advantageous aspect of that type of mounting is that the contact areas and the linking conductor tracks connecting the contact areas to the connection pads are made by silkscreen printing a conductive polymer after the integrated circuit has been fixed to the card.

It will be observed that in this mounting, the connection pads of the integrated circuit emerge in the face of the card which includes the contact areas, unlike the prior mounting in which the connection pads of the integrated circuit face away from the contact areas. If an integrated circuit designed for mounting in a module is used with the new type of mounting, then the fact of the integrated circuit being turned upside-down inverts the positions of the connection pads relative to the contact areas whose positions are standardized.

Since the contact areas are disposed in two parallel rows, it is naturally possible in the new mounting to choose an orientation for the integrated circuit so that a row of connection pads faces the corresponding row of contact areas. Nevertheless the connection pads of the integrated circuit are still in the opposite order to the contact areas so it is necessary to make linking conductor tracks that go round the contact areas, as shown in FIG. 1, in order to ensure that each integrated circuit connection pad is properly connected to the contact area corresponding thereto. The linking conductor tracks are thus relatively long, and given their small thickness, they present relatively high resistance. In addition, the long length of the linking conductor tracks increases the risk of short circuiting between two linking conductor tracks or the risk of a track being interrupted by lack of conductive material, in particular when the linking conductor tracks are made by silkscreen printing.

As an indication, in the embodiment of FIG. 1, the length of the longest linking conductor track is about 15 mm, and the total length of the linking conductor tracks is about 47 mm. In order to reduce the length of the linking conductor tracks, it would indeed be possible to ask the integrated circuit manufacturer to dispose the connection pads so as to be immediately in register with the corresponding contact areas. Nevertheless, the cost of an integrated circuit depends on the number of circuits of the same kind that are made, and requesting a special integrated circuit for the new mounting would increase the cost of the integrated circuit by an amount that would be unacceptable, given the very fierce competition that exists at present in the field of manufacturing integrated circuit cards.

Also known, from document WO-93/22475, is an integrated circuit having connection pads that emerge in a face of the integrated circuit, where said face is covered in at least a first insulating layer having openings in register with the connection pads, and in which at least one conductor track extends over the first insulating layer and has one end connected to one of the connection pads of the integrated circuit. Nevertheless, that document relates to making solder pads on a face of the integrated circuit and is not concerned in any way with the problem of repositioning integrated circuit pads in a manner that can go as far as fully inverting the initial positioning.

OBJECTS AND SUMMARY OF THE INVENTION

According to the invention, the integrated circuit has a second insulating area covering the first insulating area and including openings in register with each conductor track of the first insulating layer and in register with connection pads that are not connected to conductor tracks, at least one repositioning conductor track extending over the second insulating layer and having one end connected to the conductor track of the first insulating layer. It is thus possible to cross two repositioning conductor tracks without making a short circuit between the two tracks, thereby inverting the positions of two connection pads that are repositioned relative to the corresponding positions of the connection pads of the integrated circuit.

In another advantageous aspect of the invention, the integrated circuit includes a covering insulating layer including an opening defining a repositioned connection pad in register with each repositioning conductor track, and also an opening that coincides with each of the non-repositioned connection pads.

BRIEF DESCRIPTION OF THE DRAWINGS

Other characteristics and advantages of the invention appear on reading the following description of a particular, non-limiting embodiment of the invention given with reference to the accompanying figures, in which:

FIG. 1 is a greatly enlarged fragmentary face view of an integrated circuit card having a prior art integrated circuit;

FIG. 2 is a view analogous to FIG. 1 of a card fitted with an integrated circuit of the invention; and FIGS. 3 to 8 are highly enlarged perspective views of the integrated circuit of the invention during various stages in repositioning the connection pads.

MORE DETAILED DESCRIPTION

With reference to FIG. 1, there can be seen an integrated circuit card having an integrated circuit of a type designed to be mounted by means of a module, but instead the integrated circuit is mounted in the card directly. The integrated circuit 1 has connection pads 2 emerging in one of its faces. To understand the invention better, the connection pads are given individual references 2.1 to 2.5 as a function of their positions on the integrated circuit. The connection pads 2 are connected to contact areas 3 by linking conductor tracks 4. The contact areas are given individual references 3.1 to 3.5 and the linking conductor tracks are given individual references 4.1 to 4.5. As explained above, the connection pads are disposed in an order opposite to that of the contact pads so in order to make the linking conductor tracks 4 in a single silkscreen printing operation it is necessary to provide for the linking conductor tracks 4.1, 4.2, and 4.4 to go round contact areas 3.3 and 3.5 so as to make a connection with the corresponding contact areas without any of the linking conductor tracks crossing one another.

FIG. 2 shows how the array of linking conductor tracks is simplified when using connection pads 12 that have been repositioned in accordance with the invention. It can immediately be seen that the length of the linking conductor tracks 4.1, 4.2, and 4.4 is considerably shorter than in FIG. 1. In practice, the total length of linking conductor tracks can be reduced to only 13 mm.

The various steps of repositioning the connection pads in accordance with the invention are described below with reference to FIGS. 3 to 8.

FIG. 3 shows the integrated circuit in its initial state, i.e. with connection pads disposed for mounting in a module.

FIG. 4 shows the integrated circuit after a first insulating layer 5 has been into place that includes openings 6 given respective numbers 6.1 to 6.5 in register with the connection pads 2 of the integrated circuit. These openings are preferably made to be large so as to reduce the accuracy that is necessary for positioning them in register with the connection pads 2.

FIG. 5 shows the integrated circuit after repositioning conductor tracks 7 have been put into place which extend over the first insulating layer 5, each of which tracks has one end connected to one of the connection pads of the integrated circuit by passing through the corresponding opening 6. In this context it will be observed that in the embodiment shown, the purpose of repositioning is to invert the positions of connection pads 2.1 and 2.3, and also to invert the positions of connection pads 2.4 and 2.5. To this end, the repositioning conductor tracks 7 extend over the first insulating layer 5 to about halfway towards the desired final repositioned position.

FIG. 6 shows the integrated circuit fitted with a second insulating layer 8 having openings 9 carrying respective numerical references 9.1 to 9.5 given with reference to the corresponding repositioning conductor tracks or the connection pads with which they are associated. In this context, it will be observed that since connection pad 2.2 is not repositioned, it is not associated with any repositioning track. The openings 9.1, 9.3, 9.4, and 9.5 are in register respectively with the ends of the repositioning conductor tracks 7 whose opposite ends are connected to the connection pads 2.

FIG. 7 shows the integrated circuit fitted with the repositioning conductor tracks 10 that extend over the second insulating layer 8 each having one end connected to the corresponding repositioning conductor track 7. The repositioning conductor tracks 10 extend to the desired locations for the repositioned connection pads.

FIG. 8 shows the integrated circuit fitted with an insulating covering layer 11 having openings 12 that define the repositioned pads in register with each repositioning conductor track, and an opening 12.2 in register with the non-repositioned connection pad 2.2.

The insulating layers and the repositioning conductor tracks are presently made by silkscreen printing or by vacuum deposition on the integrated circuit while it is still associated with other integrated circuits in the form of a silicon wafer. The connection pads of a very large number of integrated circuits are thus repositioned simultaneously. By way of example, the insulating layers are made of an insulating polymer such as a polyamide and the repositioning conductor tracks are made, for example, of a conductive polymer.

To prevent the top surface of connection pad 2.2 being at a level that is different from the level of the repositioned connection pads, provision can be made in each step to fill the corresponding opening in the insulating layer with a drop of conductive polymer.

Naturally, the invention is not limited to the embodiment described and variants can be applied thereto without going beyond the ambit of the invention as defined by the claims.

In particular, although the invention is shown with reference to an integrated circuit in which it is desired to invert the positions of four connection pads of the integrated circuit, it is also possible to implement the invention to displace only one connection pad or to displace a plurality of connection pads to new positions that do not require crossovers to be provided in the repositioning conductor tracks. Under such circumstances, it is possible to provide repositioning while using only one insulating layer.

In this context, it should be observed that by repositioning connection pads in accordance with the invention it is possible not only to reduce the length of the linking conductor tracks, but also to define a standard layout for such linking conductor tracks, with any particular integrated circuit then being adapted to such a standard layout by appropriate repositioning of its connection pads.

We claim:

1. An integrated circuit having connection pads (2) having a first position emerging in a face of the integrated circuit, said face being covered in a first insulating layer (5) having first openings (6) in register with certain ones of said connection pads (2) and at least one conductor track (7) extending over the first insulating layer (5) and having one end connected through said first openings to one of the connection pads of the integrated circuit, a second insulating layer (8) covering the first insulating layer and including second openings (9) in register with said conductor track (7) of the first layer and in register with other connection pads (2.2) that are not connected to corresponding conductor tracks (7), at least one repositioning conductor track (10) extends over the second insulating layer (8) and has one end connected through said second openings to a corresponding conductor track (7) of the first insulating layer, whereby the repositioning conductor track (10) and the corresponding conductor track (7) reposition a corresponding connection pad from said first position to a second repositioned position.

2. An integrated circuit according to claim 1, including a covering insulating layer (11) having an opening (12) defining a repositioning connection pad in register with each repositioning conductor track (10), and an opening (12.2) in register with each of the connection pads that is not repositioned.

3. An integrated circuit according to claim 1, wherein the conductive repositioning tracks (10) are made of conductive polymer.

* * * * *